(12) United States Patent
Yoshimatsu et al.

(10) Patent No.: US 10,104,775 B2
(45) Date of Patent: Oct. 16, 2018

(54) SEMICONDUCTOR DEVICE AND METHOD FOR MANUFACTURING THE SAME

(71) Applicant: Mitsubishi Electric Corporation, Tokyo (JP)

(72) Inventors: Naoki Yoshimatsu, Tokyo (JP); Masayoshi Shinkai, Tokyo (JP); Taketoshi Shikano, Tokyo (JP); Daisuke Murata, Tokyo (JP); Nobuyoshi Kimoto, Tokyo (JP); Yuji Imoto, Tokyo (JP); Mikio Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/269,585

(22) Filed: May 5, 2014

(65) Prior Publication Data
US 2015/0092379 A1    Apr. 2, 2015

(30) Foreign Application Priority Data

Sep. 30, 2013  (JP) .................................. 2013-202995

(51) Int. Cl.
*H05K 1/18*    (2006.01)
*H05K 3/06*    (2006.01)
(Continued)

(52) U.S. Cl.
CPC ................. *H05K 1/18* (2013.01); *H05K 3/06* (2013.01); *H05K 3/20* (2013.01); *H05K 3/284* (2013.01);
(Continued)

(58) Field of Classification Search
CPC ......... H05K 2203/1184; H05K 3/1258; H05K 3/284; H01L 27/11573; H01L 27/11582
(Continued)

(56) References Cited

U.S. PATENT DOCUMENTS 5,557,150 A * 9/1996 Variot ................. G03F 7/70433
257/666
6,025,640 A * 2/2000 Yagi et al. .................... 257/666
(Continued)

FOREIGN PATENT DOCUMENTS

CN          101553908 A    10/2009
JP          S62-252159 A   11/1987
(Continued)

OTHER PUBLICATIONS

An Office Action issued by the German Patent Office dated Oct. 17, 2016, which corresponds to German Patent Application No. 10 2014 213 564.8 and is related to U.S. Appl. No. 14/269,585; with English language partial translation.

(Continued)

*Primary Examiner* — Jarrett Stark
*Assistant Examiner* — Charles N Ausar-El
(74) *Attorney, Agent, or Firm* — Studebaker & Brackett PC (57) ABSTRACT

A semiconductor device according to the present invention includes a ceramic substrate, a plurality of circuit patterns arranged on a surface of the ceramic substrate, a semiconductor element arranged on an upper surface of at least one circuit pattern, and a sealing resin for sealing the ceramic substrate, the plurality of circuit patterns, and the semiconductor element, in which an undercut part is formed in opposed side surfaces of the circuit patterns adjacent to one another, the undercut part is configured such that an end of an upper surface of the circuit pattern protrudes outside the circuit pattern more than an end of a lower surface of the circuit pattern on the ceramic substrate, and the undercut part is also filled with the sealing resin.

13 Claims, 5 Drawing Sheets

(51) Int. Cl.
*H05K 3/20* (2006.01)
*H05K 3/28* (2006.01)
*H05K 1/03* (2006.01)
*H05K 1/02* (2006.01)

(52) U.S. Cl.
CPC ........... *H01L 2224/32225* (2013.01); *H01L 2224/48091* (2013.01); *H01L 2224/48227* (2013.01); *H01L 2224/73265* (2013.01); *H01L 2924/13055* (2013.01); *H05K 1/0203* (2013.01); *H05K 1/0306* (2013.01); *H05K 2201/0373* (2013.01); *H05K 2201/09036* (2013.01); *H05K 2203/049* (2013.01); *H05K 2203/1184* (2013.01); *H05K 2203/1316* (2013.01); *Y10T 29/41* (2015.01)

(58) Field of Classification Search
USPC .................................................. 257/787
See application file for complete search history.

(56) References Cited

U.S. PATENT DOCUMENTS

| | | | | |
|---|---|---|---|---|
| 6,713,849 | B2* | 3/2004 | Hasebe | H01L 23/3107 257/667 |
| 6,967,396 | B1* | 11/2005 | Shibata | 257/684 |
| 7,034,382 | B2* | 4/2006 | Palmteer et al. | 257/676 |
| 7,152,316 | B2* | 12/2006 | Mori | H01L 21/565 257/E21.504 |
| 7,262,491 | B2* | 8/2007 | Islam et al. | 257/670 |
| 7,319,266 | B2* | 1/2008 | St. Germain et al. | 257/676 |
| 7,402,462 | B2 | 7/2008 | Madrid et al. | |
| 7,429,790 | B2* | 9/2008 | Condie et al. | 257/709 |
| 7,679,914 | B2* | 3/2010 | Kashiwazaki | H01L 23/4334 257/675 |
| 7,732,937 | B2* | 6/2010 | Goller | H01L 21/565 257/666 |
| 7,781,899 | B2* | 8/2010 | Sim | H01L 23/49503 257/666 |
| 7,906,859 | B2* | 3/2011 | Yoshioka | H01L 23/3107 257/788 |
| 7,964,957 | B2* | 6/2011 | Noguchi | H05K 1/05 257/684 |
| 8,153,480 | B2* | 4/2012 | Steenbruggen | H01L 23/315 257/666 |
| 8,178,955 | B2* | 5/2012 | Itou et al. | 257/667 |
| 8,334,598 | B2* | 12/2012 | Nishibori et al. | 257/772 |
| 8,350,392 | B2* | 1/2013 | Yanagisawa et al. | 257/787 |
| 8,426,962 | B2* | 4/2013 | Sasaki et al. | 257/717 |
| 8,461,755 | B2* | 6/2013 | Shida | H05K 1/0274 313/501 |
| 8,536,689 | B2* | 9/2013 | Dimaano, Jr. | H01L 23/3107 257/666 |
| 8,637,979 | B2* | 1/2014 | Miyamoto | 257/712 |
| 8,659,050 | B2* | 2/2014 | Seo | H01L 33/486 257/100 |
| 8,659,106 | B2* | 2/2014 | Nishijima | H01L 33/486 257/100 |
| 8,669,649 | B2* | 3/2014 | Camacho | H01L 21/4832 257/676 |
| 8,912,640 | B2* | 12/2014 | Takada et al. | 257/687 |
| 2001/0004133 | A1 | 6/2001 | Ihara | |
| 2002/0136873 | A1* | 9/2002 | Li | H05K 3/4038 428/209 |
| 2003/0006055 | A1* | 1/2003 | Chien-Hung | H01L 23/3107 174/534 |
| 2003/0006500 | A1* | 1/2003 | Tatoh | H01L 21/4846 257/703 |
| 2003/0066865 | A1* | 4/2003 | Tsukaguchi | H05K 3/06 228/122.1 |
| 2004/0262752 | A1* | 12/2004 | Ito | H01L 23/3107 257/734 |
| 2005/0073036 | A1* | 4/2005 | Appelt | H01L 23/4334 257/678 |
| 2007/0015316 | A1* | 1/2007 | Madrid et al. | 438/123 |
| 2007/0215903 | A1* | 9/2007 | Sakamoto | H01L 23/49844 257/192 |
| 2008/0128920 | A1* | 6/2008 | Enomoto | H01L 21/565 257/783 |
| 2009/0152714 | A1* | 6/2009 | Yamagishi | H01L 23/315 257/724 |
| 2010/0283142 | A1 | 11/2010 | Feng et al. | |
| 2011/0267789 | A1* | 11/2011 | Chew | H01L 21/4832 361/767 |
| 2012/0160545 | A1* | 6/2012 | Sakamoto | B29C 45/14819 174/251 |
| 2013/0140714 | A1* | 6/2013 | Numazaki | H01L 23/495 257/782 |
| 2013/0241041 | A1* | 9/2013 | Yu | H01L 24/97 257/676 |
| 2013/0341775 | A1* | 12/2013 | Ota et al. | 257/668 |
| 2014/0048918 | A1* | 2/2014 | Nagaune | H01L 23/4334 257/675 |
| 2014/0159076 | A1* | 6/2014 | Sota | H01L 33/60 257/88 |
| 2014/0252401 | A1* | 9/2014 | Nakabayashi | H01L 33/62 257/99 |
| 2015/0035138 | A1* | 2/2015 | Miyamoto et al. | 257/712 |
| 2015/0092379 | A1 | 4/2015 | Yoshimatsu et al. | |

FOREIGN PATENT DOCUMENTS

| | | |
|---|---|---|
| JP | H01-106456 A | 4/1989 |
| JP | H6-13501 A | 1/1994 |
| JP | H06-045346 A | 2/1994 |
| JP | 06085132 * | 3/1994 |
| JP | H06-045346 U | 6/1994 |
| JP | H6-252534 A | 9/1994 |
| JP | H07-161911 A | 6/1995 |
| JP | 2000-277809 A | 10/2000 |
| JP | 2006-032617 A | 2/2006 |
| JP | 2008-108957 A | 5/2008 |
| JP | 4319591 B2 | 8/2009 |
| JP | 2010-087129 A | 4/2010 |
| JP | 2011-153928 A | 8/2011 |
| JP | 2015-70107 A | 4/2015 |

OTHER PUBLICATIONS

An Office Action; "Notification of Reason(s) for Refusal" issued by the Japanese Patent Office dated Nov. 22, 2016, which corresponds to Japanese Patent Application No. 2013-202995 and is related to U.S. Appl. No. 14/269,585; with English language partial translation.

An Office Action issued by the Chinese Patent Office dated Feb. 4, 2017, which corresponds to Chinese Patent Application No. 201410409776.9 and is related to U.S. Appl. No. 14/269,585; with partial English language translation.

An Office Action; "Decision of Refusal", issued by the Japanese Patent Office dated Jul. 4, 2017, which corresponds to Japanese Patent Application No. 2013-202995 and is related to U.S. Appl. No. 14/269,585; with partial English language translation.

An Office Action issued by the Chinese Patent Office (SIPO) dated Sep. 21, 2017, which corresponds to Chinese Patent Application No. 201410409776.9 and is related to U.S. Appl. No. 14/269,585; with partial English language translation.

An Office Action issued by the Chinese Patent Office dated Apr. 17, 2018, which corresponds to Chinese Patent Application No. 201410409776.9 and is related to U.S. Appl. No. 14/269,585; with English translation.

An Office Action; "Notice of Reasons for Refusal," issued by the Japanese Patent Office dated Apr. 3, 2018, which corresponds to Japanese Patent Application No. 2017-157093 and is related to U.S. Appl. No. 14/269,585; with English Translation.

* cited by examiner

SEMICONDUCTOR DEVICE AND METHOD FOR MANUFACTURING THE SAME

BACKGROUND OF THE INVENTION

Field of the Invention

The present invention relates to a semiconductor device and a method for manufacturing the same, and more particularly to a semiconductor device used for an inverter or a regenerating converter to control a motor of an electric vehicle, an electric railcar, or the like, and a method for manufacturing the same.

Description of the Background Art

A conventional semiconductor device includes a ceramic substrate, circuit patterns arranged on the ceramic substrate, a semiconductor element packaged on the circuit pattern, and bonding wires to connect the circuit patterns, or the circuit pattern and the semiconductor element. The semiconductor device is provided with an insulating part in which the ceramic substrate is exposed, in order to insulate the circuit patterns from each other. A size of the ceramic substrate depends on an area of the circuit pattern and a width of the insulating part.

The ceramic substrate, the circuit patterns, the semiconductor element, and the bonding wires are sealed with an epoxy resin, for example. Adhesion properties between the ceramic substrate and the circuit pattern, and the epoxy resin are poor, so that resin sealing is performed after a polyimide resin or a polyamide-imide resin having low Young's modulus has been previously applied to the ceramic substrate in order to prevent the epoxy resin from being separated (refer to Japanese Patent Application Laid-Open No. 2006-32617, for example).

The conventional semiconductor device is configured as described above, so that in order to miniaturize the ceramic substrate, it is necessary to reduce the area of the circuit pattern or narrow the width of the insulating part, which causes the problem that assemblability and insulating properties are deteriorated.

In addition, in order to suppress separation of the epoxy resin, it is necessary to apply the resin having low Young's modulus, so that a step for the application is needed in a manufacturing process, which increases manufacturing costs. In a case where the resin having low Young's modulus is not applied to reduce the manufacturing costs, adhesion properties of the epoxy resin are deteriorated, and separation is generated. When the epoxy resin is separated, the problem is that a bonding lifetime of a component (such as an aluminum wire or a terminal) held by the epoxy resin is reduced, and the insulating properties are deteriorated between the circuit patterns on the ceramic substrate.

SUMMARY OF THE INVENTION

An object of the present invention is to provide a semiconductor device capable of miniaturizing the semiconductor device and improving reliability of it at low cost, and a method for manufacturing the same.

A semiconductor device according to the present invention includes a ceramic substrate, a plurality of circuit patterns arranged on a surface of the ceramic substrate, a semiconductor element arranged on an upper surface of at least one circuit pattern, and a sealing resin for sealing the ceramic substrate, the plurality of circuit patterns, and the semiconductor element. An undercut part is formed in opposed side surfaces of the circuit patterns adjacent to one another, and the undercut part is configured such that an end of an upper surface of the circuit pattern protrudes outside the circuit pattern more than an end of a lower surface of the circuit pattern on the ceramic substrate. In addition, the undercut part is also filled with the sealing resin.

Since the undercut part is provided in each of the opposed side surfaces of the adjacent circuit patterns, an area of a bottom surface of the circuit pattern can be reduced without reducing an area of the upper surface of the circuit pattern. That is, when the undercut part is provided, it is possible to obtain two effects of miniaturizing the semiconductor device due to improvement in insulating properties and improving reliability of it due to suppression of separation, at the same time.

These and other objects, features, aspects and advantages of the present invention will become more apparent from the following detailed description of the present invention when taken in conjunction with the accompanying drawings.

DESCRIPTION OF THE PREFERRED EMBODIMENTS

<Prerequisite Art>

Figure 10:
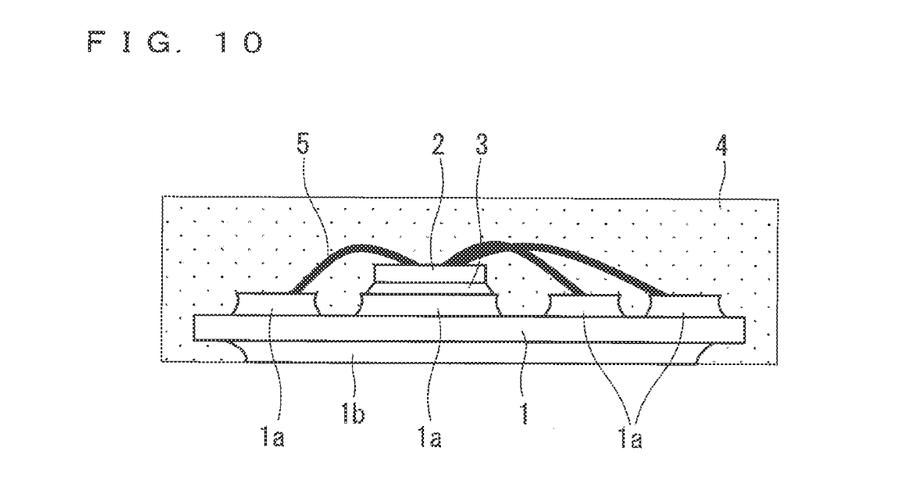
FIG. 10 is a cross-sectional view of a semiconductor device according to a prerequisite art.

Before preferred embodiments of the present invention are described, a prerequisite art of the present invention will be described. FIG. 10 is a cross-sectional view of a semiconductor device according to the prerequisite art. As shown in FIG. 10, a plurality of circuit patterns 1a are arranged on a surface of a ceramic substrate 1 of the semiconductor device according to the prerequisite art. A semiconductor element 2 is bonded to an upper surface of at least one circuit pattern 1a with solder 3 so as to be packaged. An electrode of the semiconductor element 2 and the other circuit pattern 1a are electrically connected with an aluminum wire 5. In addition, the circuit pattern 1a is bonded to a terminal (not shown) by soldering or welding so as to be electrically connected to an external terminal. A back-surface pattern 1b is formed on a back surface of the ceramic substrate 1. The back surface is the surface opposite to the surface on which the circuit patterns 1a are arranged. Further, a material of the circuit pattern 1a is aluminum or copper in general.

The ceramic substrate 1, the circuit patterns 1a, the semiconductor element 2, and the aluminum wire 5 are sealed with a sealing resin 4. The sealing resin 4 is an epoxy resin, for example. In addition, the back-surface pattern 1b is not sealed with the sealing resin, but exposed to a lower surface of the semiconductor device.

The semiconductor device described above is used, for example, as an inverter or a regenerating converter to control a motor of an electric vehicle, an electric railcar, or the like.

The semiconductor device according to the prerequisite art is configured as described above, so that in order to miniaturize the ceramic substrate 1, it is necessary to reduce an area of the circuit pattern 1a, or narrow a width of an insulating part between the circuit patterns 1a, which could deteriorate assemblability and insulating properties.

In addition, since adhesion properties are poor between the sealing resin 4, and the ceramic substrate 1 and the circuit pattern 1a, there is a problem that separation is generated. When the sealing resin 4 is separated, the problem is that a bonding lifetime of a component (such as the aluminum wire or the terminal) held by the sealing resin 4 is reduced, and the insulating properties are deteriorated between the circuit patterns 1a on the ceramic substrate 1.

<First Preferred Embodiment>
<Configuration>

Figure 1:
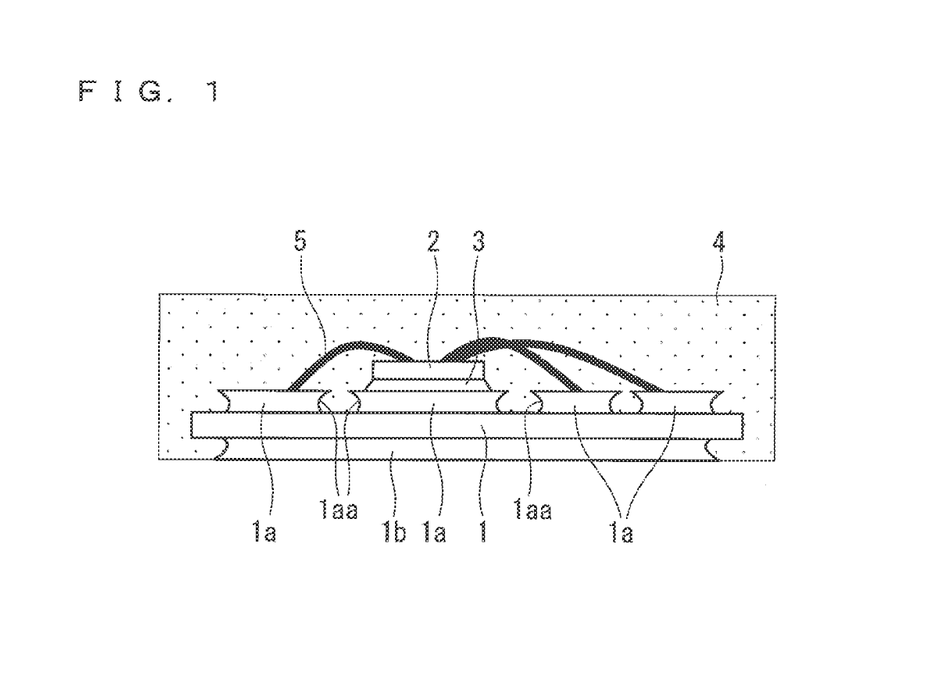
FIG. 1 is a cross-sectional view of a semiconductor device according to a first preferred embodiment.
Figure 2:
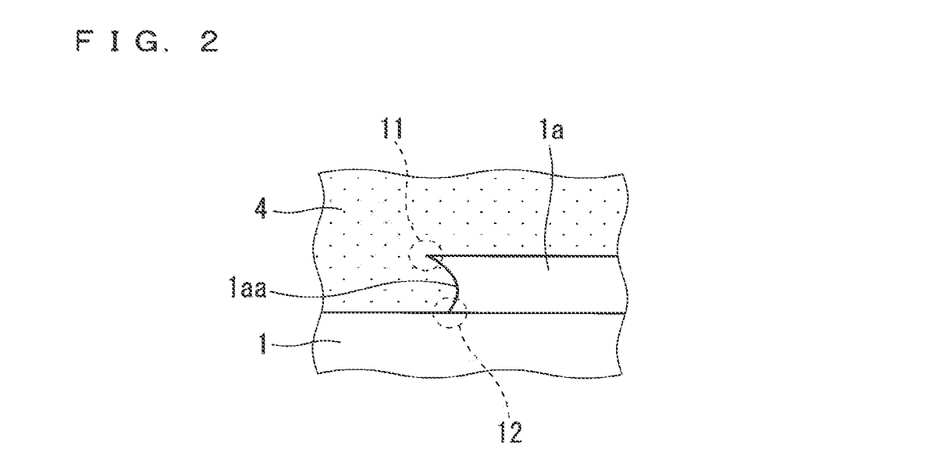
FIG. 2 is a partially enlarged view of a cross section of the semiconductor device according to the first preferred embodiment.
Figure 3:
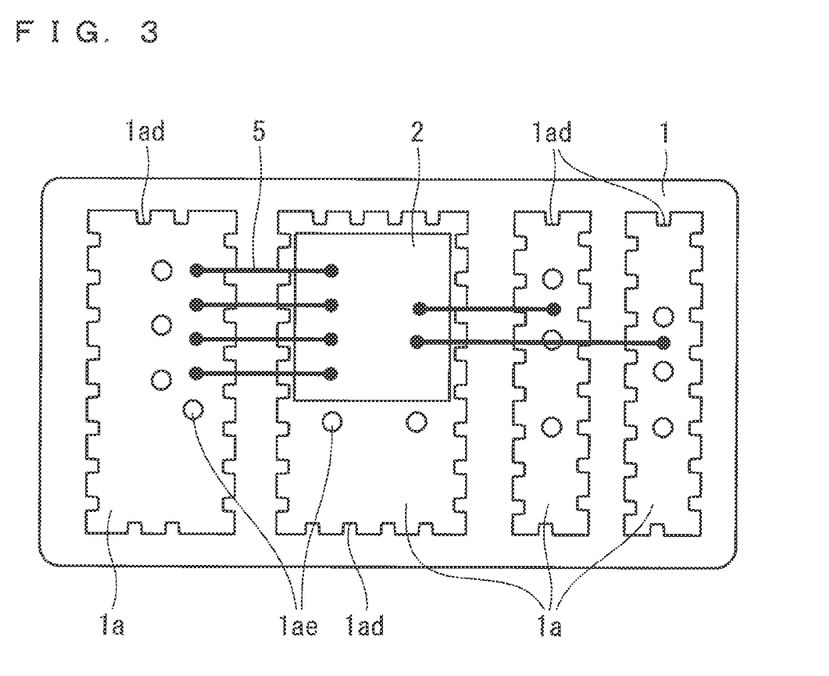
FIG. 3 is a plan view of the semiconductor device according to the first preferred embodiment.

FIG. 1 is a cross-sectional view of a semiconductor device according to this preferred embodiment. FIG. 2 is a partially enlarged view of a cross-section of the semiconductor device in this preferred embodiment. More particularly, FIG. 2 is an enlarged view of a cross section of a side surface of a circuit pattern 1a in the cross-sectional view in FIG. 1. In addition, FIG. 3 is a plan view of the semiconductor device in this preferred embodiment.

According to the semiconductor device in this preferred embodiment, the plurality of circuit patterns 1a are arranged on a surface of a ceramic substrate 1. A semiconductor element 2 is bonded to an upper surface of at least one circuit pattern 1a with solder 3 so as to be packaged.

As shown in FIG. 1, an undercut part 1aa is formed in each of opposed side surfaces of the adjacent circuit patterns 1a. FIG. 2 shows an enlarged view of the undercut part 1aa. The undercut part 1aa is configured such that an end 11 of an upper surface of the circuit pattern 1a protrudes outside the circuit pattern 1a more than an end 12 of a lower surface of the circuit pattern 1a on the ceramic substrate 1. The undercut part 1aa is also filled with the sealing resin 4. In addition, the undercut part 1aa may be formed in a side surface of the circuit pattern 1a which is not opposed to the other circuit pattern 1a.

A planar shape of the circuit pattern 1a of the semiconductor device in this preferred embodiment will be described with reference to FIG. 3. The circuit pattern 1a has recessed parts 1ad in planar view along an outer periphery of the circuit pattern 1a. The recessed part 1ad is sealed with the sealing resin 4. In addition, a hole 1ae is formed in the upper surface of the circuit pattern 1a, and the hole 1ae is also filled with the sealing resin 4. As shown in FIG. 2, the undercut part 1aa is formed in a side surface of the recessed part 1ad. In addition, the undercut part 1aa may be also formed in a side surface of the hole 1ae.

In addition, the semiconductor element 2 in this preferred embodiment is an insulated gate bipolar transistor (IGBT) including a wide bandgap semiconductor such as silicon carbide (SiC), gallium nitride (GaN), or the like.

<Manufacturing Method>

A method for manufacturing the semiconductor device in this preferred embodiment will be described. Firstly, a metal film is formed on the surface of the ceramic substrate 1. The metal film is formed by attaching metal foil having a thickness of 0.1 mm to 2 mm, for example, to the surface of the ceramic substrate 1. In addition, a back-surface pattern 1b is formed on a back surface of the ceramic substrate 1.

Then, the metal film is etched, whereby the circuit pattern 1a is formed. At the time of etching, the undercut part 1aa is formed by over-etching the side surface of the circuit pattern 1a. By adjusting an etching time, a spraying condition, and the like, the side surface of the circuit pattern 1a is etched into a round shape, so that the undercut part 1aa can be formed such that the end 11 of the upper surface of the circuit pattern 1a protrudes outside more than the end 12 of the lower surface of the circuit pattern 1a on the ceramic substrate 1.

Then, the semiconductor element 2 is packaged in a predetermined position of the circuit pattern 1a via the solder 3. In addition, the other circuit pattern 1a and an electrode of the semiconductor element 2 are connected by wire bonding with an aluminum wire 5.

Further, the ceramic substrate 1, the circuit patterns 1a, the semiconductor element 2, and the aluminum wire 5 are sealed with the sealing resin 4 (such as epoxy resin). The resin sealing is performed by transfer molding, for example. In addition, a surface of the back-surface pattern 1b is not sealed, and exposed to the lower surface of the semiconductor device. Through the above processes, the semiconductor device according to this preferred embodiment is manufactured.

<Operation>

As described above, according to the semiconductor device in this preferred embodiment, the semiconductor element 2 is bonded to the circuit pattern 1a arranged on the surface of the ceramic substrate 1, with brazing filler metal such as the solder 3, and the semiconductor element 2 and the other circuit pattern 1a are connected with the aluminum wire. The circuit pattern 1a is wired on the ceramic substrate so as to be electrically connected to an external terminal by soldering and wire bonding.

Thus, in order to reduce an area of the ceramic substrate 1 for miniaturizing the semiconductor device, it is necessary to secure functionally necessary amount of area and width with respect to the circuit patterns 1a, respectively. Further, a potential difference ranging from several hundred volts to a thousand volts or more is generated between the circuit patterns 1a during an operation of the semiconductor device in some cases. In order to prevent discharge at an interface between the sealing resin 4 and the ceramic substrate 1, it is necessary to provide a certain interval between the circuit patterns 1a required for their insulation.

Thus, according to this preferred embodiment, the undercut part 1aa is provided in each of the opposed side surfaces of the adjacent circuit patterns 1a. When the undercut part 1aa is provided, an area of a bottom surface of the circuit pattern 1a can be reduced without reducing an area of the upper surface of the circuit pattern 1a. That is, when the area of the bottom surface of the circuit pattern 1a is reduced, the interval between the adjacent circuit patterns 1a is increased on the surface of the ceramic substrate 1, so that the insulating properties are improved. Thus, in a case where the semiconductor device is designed so as to have the same degree of insulating properties as those in the prerequisite art not having the undercut part 1aa, the plurality of circuit patterns 1a can be arranged closer to each other, compared with the case of the prerequisite art, so that the area of the ceramic substrate 1 on which the circuit patterns 1*a* are arranged can be reduced.

Furthermore, in general, as for the semiconductor device, each component configuring the semiconductor device expands or contracts by an amount provided by multiplying an amount of temperature change and a linear expansion coefficient, due to a change in environmental temperature and heat generation of the semiconductor element. Therefore, distortion is generated in an interface between the components, and especially a part having large distortion or low bonding strength is separated or cracked. As for the epoxy resin, its linear expansion coefficient can be controlled in its manufacturing process, but when the linear expansion coefficient of the epoxy resin is adjusted to that of copper (having linear expansion coefficient of 16.7 ppm/° C.), a difference in linear expansion coefficient between the epoxy resin and ceramics (4 ppm/° C. to 7 ppm/° C.) is increased or decreased. Furthermore, the bonding properties between the epoxy resin, and ceramics, copper, and aluminum are originally poor, so that the resin sealing is to be performed after a resin having low Young's modulus such as polyimide has been previously applied to the bonding interface, otherwise the interface separation is likely to be generated in a cooling/heating cycle.

Thus, according to the semiconductor device in this preferred embodiment, the undercut part 1*aa* is provided in the side surface of the circuit pattern 1*a*, and the undercut part 1*aa* is filled with the sealing resin 4 (epoxy resin). When the sealing resin intrudes into the undercut part 1*aa*, the ceramic substrate 1 and the sealing resin 4 are prevented from being separated from each other. As the number of the undercut parts 1*aa* into which the sealing resin intrudes is increased in the area of the ceramic substrate 1, an effect of preventing the separation can be enhanced. When the adhesion properties between the ceramic substrate 1 and the sealing resin 4 are improved, intrusion of water and ions from outside is suppressed, so that reliability of each of the semiconductor element 2, and the bonding part of the aluminum wire 5 is improved, and as a result, reliability of the semiconductor device is improved.

<First Variation>

Figure 4:
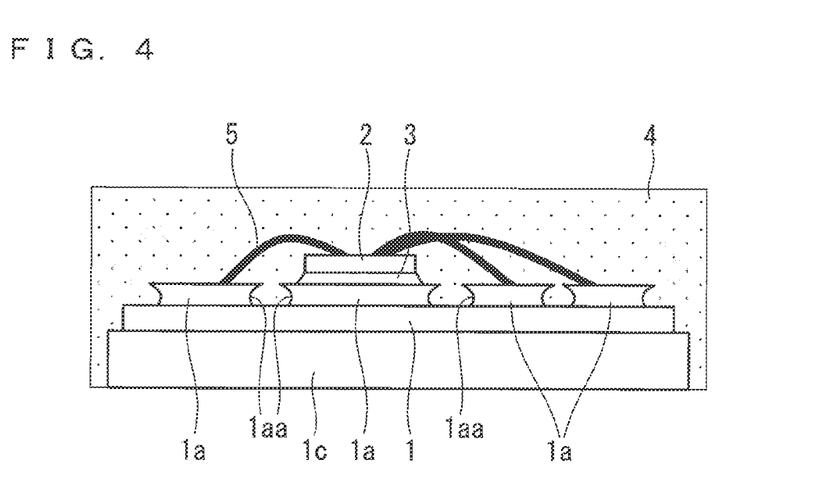
FIG. 4 is a cross-sectional view of a first variation of the semiconductor device according to the first preferred embodiment.

FIG. 4 is a cross-sectional view of a first variation of the semiconductor device in this preferred embodiment. According to this variation, a metal base 1*c* is integrally bonded to the back surface of the ceramic substrate 1. Other than that, its configuration is the same as that of the first preferred embodiment (FIG. 1), so that a description thereof is not given. Even when the metal base 1*c* is bonded to the back surface of the ceramic substrate 1, instead of the back-surface pattern 1*b*, it is possible to obtain the above-described effects of reducing the area of the ceramic substrate 1 and improving the reliability of the semiconductor device.

<Second Variation>

Figure 5:
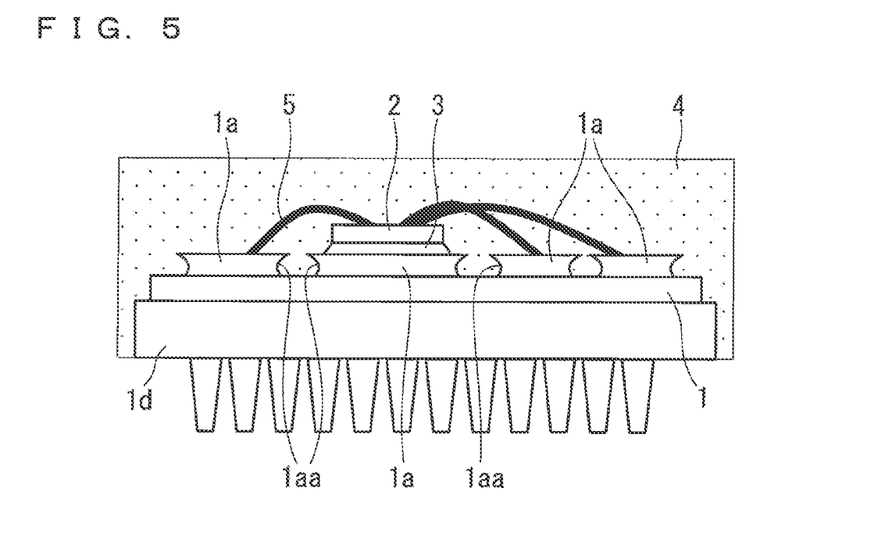
FIG. 5 is a cross-sectional view of a second variation of the semiconductor device according to the first preferred embodiment.

FIG. 5 is a cross-sectional view of a second variation of the semiconductor device in this preferred embodiment. According to this variation, a heat radiator fin 1*d* is integrally bonded to the back surface of the ceramic substrate 1. Other than that, its configuration is the same as that of the first preferred embodiment (FIG. 1), so that a description thereof is not given. Even when the heat radiator fin 1*d* is bonded to the back surface of the ceramic substrate 1, instead of the back-surface pattern 1*b*, it is possible to obtain the above-described effects of reducing the area of the ceramic substrate 1 and improving the reliability of the semiconductor device.

<Third Variation>

Figure 6:
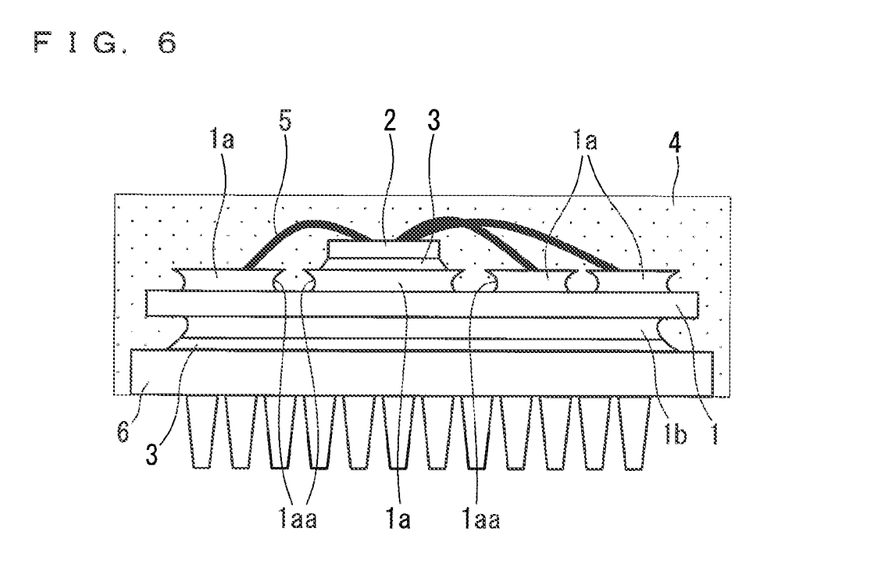
FIG. 6 is a cross-sectional view of a third variation of the semiconductor device according to the first preferred embodiment.

FIG. 6 is a cross-sectional view of a third variation of the semiconductor device in this preferred embodiment. According to this variation, the back-surface pattern 1*b* is bonded to the heat radiator fin 1*d* via the solder 3. Other than that, its configuration is the same as that of the first preferred embodiment (FIG. 1), so that a description thereof is not given. Even when the heat radiator fin 1*d* is additionally bonded to the back-surface pattern 1*b*, on the back surface of the ceramic substrate 1, it is possible to obtain the above-described effects of reducing the area of the ceramic substrate 1 and improving the reliability of the semiconductor device.

<Fourth Variation>

Figure 7:
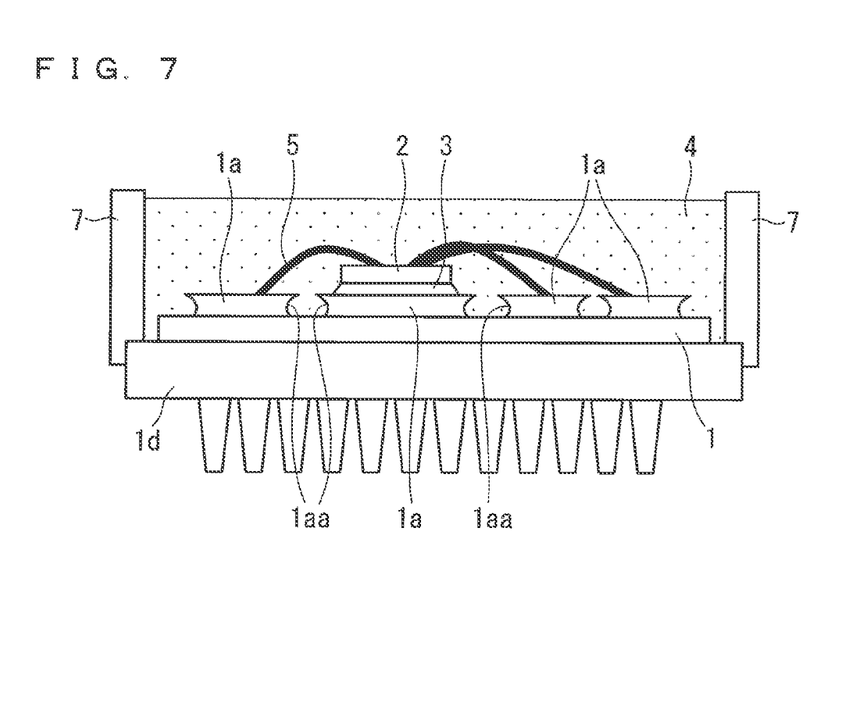
FIG. 7 is a cross-sectional view of a fourth variation of the semiconductor device according to the first preferred embodiment.

FIG. 7 is a cross-sectional view of a fourth variation of the semiconductor device in this preferred embodiment. According to this variation, the heat radiator fin 1*d* is integrally bonded to the back surface of the ceramic substrate 1. In addition, a resin case 7 is fixed on an upper surface side of the heat radiator fin 1*d* so as to surround the ceramic substrate 1, the circuit patterns 1*a*, the semiconductor element 2, and the aluminum wire 5.

The sealing resin 4 (such as an epoxy resin) is injected into the case 7, and cured, so that the ceramic substrate 1, the circuit patterns 1*a*, the semiconductor element 2, and the aluminum wire 5 are sealed with the sealing resin 4. The undercut part 1*aa* of the circuit pattern 1*a* is also filled with the sealing resin 4.

Other than that, its configuration is the same as that of the first preferred embodiment (FIG. 1), so that a description thereof is not given. Even in the case where the semiconductor device includes the case 7, and the inside of the case 7 is sealed with the sealing resin 4 which has been injected into the case 7, it is possible to obtain the above-described effects of reducing the area of the ceramic substrate 1 and improving the reliability of the semiconductor device.

<Effect>

The semiconductor device according to this preferred embodiment includes the ceramic substrate 1, the plurality of circuit patterns 1*a* arranged on the surface of the ceramic substrate 1, the semiconductor element 2 arranged on the upper surface of at least one circuit pattern 1*a*, the sealing resin 4 for sealing the ceramic substrate 1, the plurality of circuit patterns 1*a*, and the semiconductor element 2, in which the undercut part 1*aa* is formed in the opposed side surfaces of the circuit patterns 1*a* adjacent to one another, the undercut part 1*aa* is configured such that the end 11 of the upper surface of the circuit pattern 1*a* protrudes outside the circuit pattern 1*a* more than the end 12 of the lower surface of the circuit pattern 1*a* on the ceramic substrate 1, and the undercut part 1*aa* is also filled with the sealing resin 4.

Therefore, when the undercut part 1*aa* is provided in opposed side surfaces of the circuit patterns 1*a* adjacent to one another, the area of the bottom surface of the circuit pattern 1*a* can be reduced without reducing the area of the upper surface of the circuit pattern 1*a*. Thus, the functionally necessary area of the circuit pattern 1*a* can be ensured, and the interval between the circuit patterns 1*a* required for their insulation can be ensured. That is, since the interval between the adjacent circuit patterns 1*a* can be narrowed without deteriorating the insulating properties, the area of the ceramic substrate 1 on which the circuit patterns 1*a* are formed can be reduced. When the area of the ceramic substrate 1 is reduced, the semiconductor device can be miniaturized.

In addition, when the undercut part 1*aa* is provided in the side surface of the circuit pattern 1*a*, and the undercut part 1*aa* is filled with the sealing resin 4, the adhesion properties between the ceramic substrate 1 and the sealing resin 4 can be improved, so that separation of the sealing resin 4 is suppressed, and as a result, the reliability of the semiconductor device is improved. That is, when the undercut part 1*aa* is provided, it is possible to simultaneously obtain the two effects of miniaturizing the semiconductor device due to the improvement in insulating properties and improving the reliability due to suppression of separation.

Furthermore, the method for manufacturing the semiconductor device according to this preferred embodiment includes (a) a step of forming the metal film on the surface of the ceramic substrate 1, and (b) a step of forming the circuit pattern 1*a* by etching the metal film, and in the step (b), the undercut part 1*aa* is formed by over-etching the side surface of the circuit pattern 1*a*.

Therefore, according to this preferred embodiment, the undercut part 1*aa* is formed at the same time as the step of forming the circuit pattern 1*a* by etching. As a result, the undercut part 1*aa* can be formed without increasing the number of the manufacturing steps. Since the undercut part 1*aa* can be provided without increasing the number of the manufacturing steps, it is possible to obtain the two effects of miniaturizing the semiconductor device due to the improvement in insulating properties, and improving the reliability of the semiconductor device due to the suppression of the separation, without increasing the manufacturing cost.

Furthermore, according to the semiconductor device in this preferred embodiment, the circuit pattern 1*a* has the recessed parts 1*ad* in planar view along the outer periphery of the circuit pattern 1*a*, and the recessed part 1*ad* is also sealed with the sealing resin 4.

Therefore, when the recessed parts 1*ad* are formed along the outer periphery of the circuit pattern 1*a*, the area of the circuit pattern 1*a* which is in contact with the sealing resin 4 is increased. When the contact area is increased, the adhesion properties between the circuit pattern 1*a* and the sealing resin 4 are improved, so that the reliability of the semiconductor device is improved.

In addition, according to the semiconductor device in this preferred embodiment, the hole 1*ae* is formed in the upper surface of the circuit pattern 1*a*, and the hole 1*ae* is also filled with the sealing resin 4.

Therefore, since the hole 1*ae* is formed in the upper surface of the circuit pattern 1*a*, the area of the circuit pattern 1*a* which is in contact with the sealing resin 4 is increased. When the contact area is increased, the adhesion properties between the circuit pattern 1*a* and the sealing resin 4 are improved, so that the reliability of the semiconductor device is improved.

In addition, according to the semiconductor device in this preferred embodiment, the semiconductor element 2 includes the wide bandgap semiconductor.

Therefore, according to this preferred embodiment, the semiconductor element 2 is configured of the wide bandgap semiconductor such as silicon carbide (SiC), or gallium nitride (GaN). For example, since the SiC semiconductor element is applied to a high-power semiconductor device capable of performing high-speed switching operation under high temperature, the present invention capable of ensuring the insulating properties without increasing the size of the semiconductor device is especially effective. In addition, since the high-power semiconductor device operates under high temperature, the present invention capable of improving the reliability of the semiconductor device while suppressing the separation of the sealing resin 4 is especially effective.

<Second Preferred Embodiment>
<Configuration>

Figure 8:
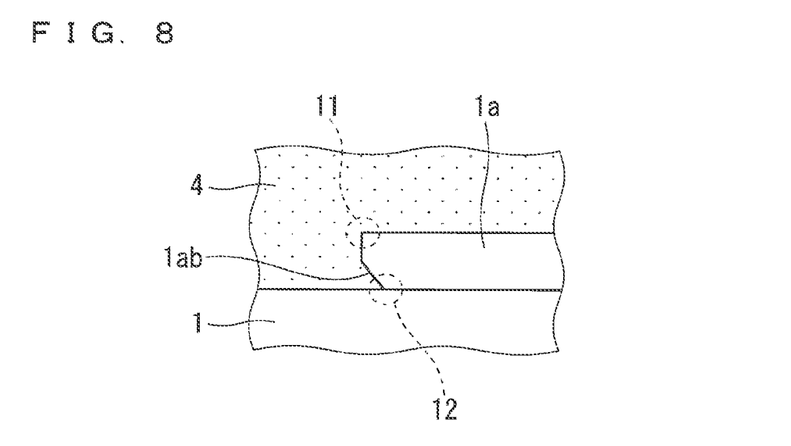
FIG. 8 is a partially enlarged view of a cross section of a semiconductor device according to a second preferred embodiment.

FIG. 8 is a partially enlarged view of a cross section of a semiconductor device according to this preferred embodiment. According to the semiconductor device in this preferred embodiment, an undercut part 1*ab* having a shape similar to the undercut part 1*aa* (FIG. 2) described in the first preferred embodiment is formed in each of opposed side surfaces of adjacent circuit patterns 1*a*. FIG. 8 shows an enlarged view of the undercut part 1*ab*.

As shown in FIG. 8, as for the undercut part 1*ab*, an end 11 of an upper surface of the circuit pattern 1*a* protrudes outside more than an end 12 of a lower surface of the circuit pattern 1*a* on a ceramic substrate 1. The undercut part 1*ab* is also filled with a sealing resin 4. While the undercut part 1*aa* in the first preferred embodiment has the round shape formed by etching, the undercut part 1*ab* in this preferred embodiment has a linear shape formed by pressing. Other than that, its configuration is the same as that of the first preferred embodiment, so that a description of the same part is not given.

<Manufacturing Method>

A method for manufacturing the semiconductor device according to this preferred embodiment will be described. Firstly, a metal plate is punched out by pressing, whereby the circuit pattern 1*a* is formed. Then, the undercut part 1*ab* is formed by pressing a certain position of the end of the lower surface of the circuit pattern 1*a* (that is, surface which is in contact with the ceramic substrate 1). Then, the circuit pattern 1*a* having the undercut part 1*ab* is attached to the surface of the ceramic substrate 1.

A step of forming a back-surface pattern 1*b*, a step of packaging a semiconductor element 2, a step of wiring with an aluminum wire 5, and a step of sealing with the sealing resin 4 are the same as those in the first preferred embodiment, so that description thereof is not given.

<Effect>

The method for manufacturing the semiconductor device according to this preferred embodiment includes (c) the step of forming the circuit pattern 1*a* by punching out the metal plate, (d) the step of forming the undercut part 1*ab* by pressing the end of the circuit pattern 1*a* after the step (c), and (e) the step of attaching the circuit pattern 1*a* to the surface of the ceramic substrate 1 after the step (d).

Therefore, since a position to be pressed can be selected, the undercut part 1*ab* is not formed in all over the periphery of the circuit pattern 1*a*, but the undercut part 1*ab* can be formed in a particular position around the circuit pattern 1*a*. Thus, in addition to the effect described in the first preferred embodiment, a degree of freedom for the position in which the undercut part 1*ab* is formed is improved.

<Third Preferred Embodiment>
<Configuration>

Figure 9:
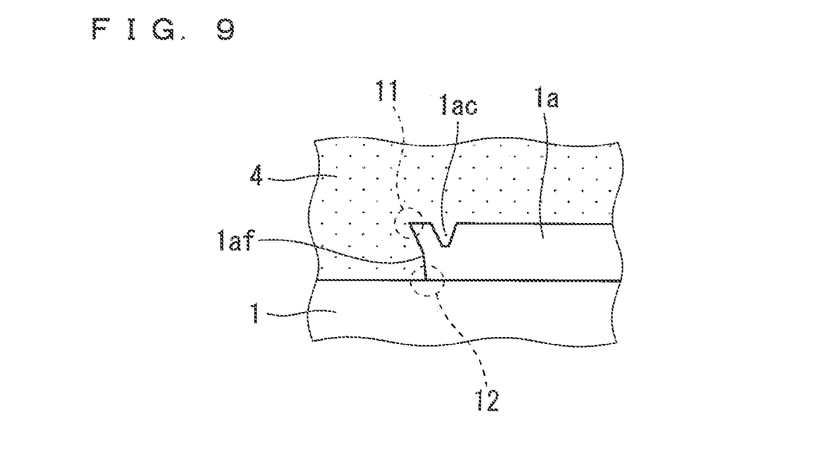
FIG. 9 is a partially enlarged view of a cross section of a semiconductor device according to a third preferred embodiment.

FIG. 9 is a partially enlarged view of a cross-section of a semiconductor device according to this preferred embodiment. According to the semiconductor device in this preferred embodiment, an undercut part 1*af* having a shape similar to that of the undercut part 1*aa* (FIG. 2) described in the first preferred embodiment is formed in each of opposed side surfaces of adjacent circuit patterns 1*a*. FIG. 9 shows an enlarged view of the undercut part 1*af*.

As shown in FIG. 9, as for the undercut part 1*af*, an end 11 of an upper surface of the circuit pattern 1*a* protrudes outside more than an end 12 of a lower surface of the circuit pattern 1a on a ceramic substrate 1. The undercut part 1af is also filled with a sealing resin 4.

In addition, a groove 1ac is formed in the upper surface of the circuit pattern 1a, along the end 11 of the upper surface of the circuit pattern 1a. A distance between the end 11 and the groove 1ac in the upper surface of the circuit pattern 1a is not more than a thickness of the circuit pattern 1a. In addition, the groove 1ac is also filled with the sealing resin 4. Other than that, the configuration is the same as that of the first preferred embodiment, so that a description of the same part is not given.

<Manufacturing Method>

A method for manufacturing the semiconductor device according to this preferred embodiment will be described. Firstly, the circuit pattern 1a is formed on a surface of the ceramic substrate 1. The circuit pattern 1a may be formed by etching, or the circuit pattern 1a may be formed by punching out a metal plate by pressing and attached on the surface of the ceramic substrate 1.

Then, the groove 1ac is formed by applying a pressure to the upper surface of the circuit pattern 1a, along the end 11 of the upper surface of the circuit pattern 1a. Here, a position to which pressure is applied is away from the end 11 of the upper surface of the circuit pattern 1a by a distance equal to or less than the thickness of the circuit pattern 1a.

When the groove 1ac is formed by applying the pressure to the position away from the end 11 by the distance equal to or less than the thickness of the circuit pattern 1a, the end 11 of the upper surface of the circuit pattern 1a is pushed outside, whereby the undercut part 1af is formed.

A step of forming a back-surface pattern 1b, a step of packaging a semiconductor element 2, a step of wiring with an aluminum wire 5, and a step of sealing with the sealing resin 4 are the same as those in the first preferred embodiment, so that a description thereof is not given. In addition, the groove 1ac is also filled with the sealing resin 4 in the sealing step.

<Effect>

According to the semiconductor device in this preferred embodiment, the groove 1ac is formed in the upper surface of the circuit pattern 1a, along the end 11 of the upper surface of the circuit pattern 1a, the distance between the end 11 and the groove 1ac of the upper surface of the circuit pattern 1a is not more than the thickness of the circuit pattern 1a, and the grove 1ac is also filled with the sealing resin 4.

Therefore, when the undercut part 1af is provided in the side surface of the circuit pattern 1a, the interval between the circuit patterns 1a can be further narrowed without deteriorating the insulating properties, as described in the first preferred embodiment. Thus, the area of the ceramic substrate 1 on which the circuit patterns 1a are formed can be reduced, and the semiconductor device can be miniaturized.

In addition, since the undercut part 1af is formed in the side surface of the circuit pattern 1a, and the undercut part 1af is filled with the sealing resin 4, the adhesion properties between the ceramic substrate 1 and the sealing resin 4 is improved, and the separation of the sealing resin 4 is suppressed, so that the reliability of the semiconductor device is improved. In addition, according to this preferred embodiment, since the groove 1ac is formed in the upper surface of the circuit pattern 1a, the area of the circuit pattern 1a which is in contact with the sealing resin 4 is increased. When the contact area is increased, the adhesion properties between the circuit pattern 1a and the sealing resin 4 are improved, so that the reliability of the semiconductor device is further improved.

In addition, the method for manufacturing the semiconductor device in this preferred embodiment includes (f) the step of forming the circuit pattern 1a on the upper surface of the ceramic substrate 1, and (g) the step of forming the groove 1ac by applying the pressure to the upper surface of the circuit pattern 1a along the end 11 of the upper surface of the circuit pattern 1a after the step (f), and in the step (g), the position to which the pressure is applied is away from the end 11 of the upper surface of the circuit pattern 1a by the distance equal to or less than the thickness of the circuit pattern 1a, and when the groove 1ac is formed, the end 11 of the upper surface of the circuit pattern 1a is pushed outside, whereby the undercut part 1af is formed.

Therefore, since the position where the groove 1ac is formed can be selected, the undercut part 1af is not formed in all over the periphery of the circuit pattern 1a, but the undercut part 1af can be formed in a particular position around the circuit pattern 1a. Further, the groove 1ac is formed in the upper surface of the circuit pattern 1a in order to form the undercut part 1af, so that the area of the circuit pattern 1a which is in contact with the sealing resin 4 is increased. When the contact area is increased, the adhesion properties between the circuit pattern 1a and the sealing resin 4 are improved, so that the reliability of the semiconductor device is improved.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a ceramic substrate;
   a plurality of circuit patterns arranged on an upper surface of said ceramic substrate;
   a semiconductor element arranged on an upper surface of at least one of said circuit patterns; and
   a sealing resin for sealing said ceramic substrate, said plurality of circuit patterns, and said semiconductor element, wherein
   an undercut part is formed in opposed side surfaces of said circuit patterns adjacent to one another,
   said undercut part is configured in such a manner that an end of an upper surface of said circuit pattern protrudes outside the circuit pattern more than an end of a lower surface of said circuit pattern on said ceramic substrate,
   said undercut part is also filled with said sealing resin,
   said sealing resin covers and is in direct contact with top and side surfaces of said ceramic substrate, said plurality of circuit patterns and said semiconductor element,
   said undercut part extends from said end of said upper surface of said circuit pattern to said end of said lower surface of said circuit pattern, and said undercut part consists of an upper linear portion and a lower linear portion when said undercut part is viewed in a side cross-sectional view, wherein said upper and lower linear portions meet at an angle, and said angle is greater than 0° and less than 180°.

2. A method for manufacturing the semiconductor device according to claim 1, comprising the steps of:
   (a) forming said circuit pattern by punching out a metal plate;
   (b) forming said undercut part by pressing an end of said circuit pattern after said step (a); and
   (c) attaching said circuit patterns to the surface of said ceramic substrate after said step (b).

3. The semiconductor device according to claim 1, wherein
   a groove is formed in the upper surface of said circuit pattern along the end of the upper surface of the circuit pattern,
   a distance between the end and said groove in the upper surface of said circuit pattern is equal to or less than a thickness of the circuit pattern, and
   said groove is also filled with said sealing resin.

4. A method for manufacturing the semiconductor device according to claim 3, comprising the steps of:
   (a) forming said circuit patterns on the surface of said ceramic substrate; and
   (b) forming said groove by applying a pressure to the upper surface of the circuit pattern along the end of the upper surface of said circuit pattern after said step (a), wherein
   in said step (b), a position to which the pressure is applied is away from the end of the upper surface of said circuit pattern by a distance equal to or less than the thickness of the circuit pattern, and
   when said groove is formed, the end of the upper surface of said circuit pattern is pushed outside, and said undercut part is formed.

5. The semiconductor device according to claim 1, wherein
   said circuit pattern has recessed parts formed continuously along an outer periphery of the circuit pattern in planar view, and the recessed parts are also sealed with said sealing resin.

6. The semiconductor device according to claim 1, wherein
   a hole is formed in the upper surface of said circuit pattern, and the hole is also filled with said sealing resin.

7. The semiconductor device according to claim 1, wherein said semiconductor element includes a wide bandgap semiconductor.

8. The semiconductor device according to claim 1, wherein said upper and lower linear portions form a shape that protrudes into the sealing resin when said undercut part is viewed in a side cross-sectional view.

9. The semiconductor device according to claim 1, wherein said upper and lower linear portions form a shape that is recessed into each of said opposed side surfaces of said circuit patterns when said undercut part is viewed in a side cross-sectional view.

10. A semiconductor device comprising:
    a ceramic substrate;
    a plurality of circuit patterns arranged on an upper surface of said ceramic substrate;
    a semiconductor element arranged on an upper surface of at least one of said circuit patterns; and
    a sealing resin for sealing said ceramic substrate, said plurality of circuit patterns, and said semiconductor element, wherein
    an undercut part is formed in opposed side surfaces of said circuit patterns adjacent to one another,
    said undercut part is configured in such a manner that an end of an upper surface of said circuit pattern protrudes outside the circuit pattern more than an end of a lower surface of said circuit pattern on said ceramic substrate,
    said undercut part is also filled with said sealing resin,
    said sealing resin covers and is in direct contact with top and side surfaces of said ceramic substrate, said plurality of circuit patterns and said semiconductor element, and
    said undercut part extends from said end of said upper surface of said circuit pattern to said end of said lower surface of said circuit pattern, and said undercut part consists of a continuously curved portion when said undercut part is viewed in a side cross-sectional view,
    wherein a portion of said continuously curved portion between said end of said upper surface of said circuit pattern and said end of said lower surface of said circuit pattern is provided closer to a center of said circuit pattern than either said end of said upper surface of said circuit pattern or said end of said lower surface of said circuit pattern,
    said circuit pattern has recessed parts formed continuously along an outer periphery of the circuit pattern in planar view, and the recessed parts are also sealed with said sealing resin,
    each of said recessed parts is defined by a first portion of said circuit pattern protruding from said outer periphery of said circuit pattern and a second portion recessed into said outer periphery of said circuit pattern in said planar view, and
    said recessed parts form a repeating, uniform pattern along said outer periphery of said circuit pattern in said planar view.

11. A method for manufacturing the semiconductor device according to claim 10, comprising the steps of:
    (a) forming a metal film on the surface of said ceramic substrate; and
    (b) forming said circuit patterns by etching said metal film, wherein
    in said step (b), said undercut part is formed by over-etching the side surfaces of said circuit patterns.

12. The semiconductor device according to claim 10, wherein
    a hole is formed in the upper surface of said circuit pattern, and the hole is also filled with said sealing resin.

13. The semiconductor device according to claim 10, wherein said semiconductor element includes a wide bandgap semiconductor.

* * * * *